United States Patent [19]

Sanderson

[11] Patent Number: 4,829,550
[45] Date of Patent: May 9, 1989

[54] CONTROLLING CHARGED PARTICLE BEAMS

[75] Inventor: Allan Sanderson, Duxford, England

[73] Assignee: The Welding Institute, Cambridge, England

[21] Appl. No.: 5,225

[22] Filed: Jan. 20, 1987

[30] Foreign Application Priority Data

Jan. 21, 1986 [GB] United Kingdom ............... 8601420

[51] Int. Cl.$^4$ ................................. B23K 9/00
[52] U.S. Cl. ................................. 378/59; 250/492.3; 219/121.13
[58] Field of Search ............ 378/57, 58, 59, 10; 250/492.1, 492.3, 398; 219/121.13, 121.14, 121.35

[56] References Cited

U.S. PATENT DOCUMENTS 3,687,716 8/1972 Steigerwald .................. 250/492.3
3,974,381 5/1976 Rohrle et al. ................. 250/492.3

FOREIGN PATENT DOCUMENTS 2421462 3/1979 France .
2165989 4/1986 United Kingdom .

Primary Examiner—Carolyn E. Fields
Assistant Examiner—David P. Porta
Attorney, Agent, or Firm—Martin Novack

[57] ABSTRACT

A method and apparatus for causing a beam of charged particles (4) to impinge on a surface of a workpiece (1,1A) along an impingement path (2) such as a weld joint line is described. The apparatus comprises an electron beam source (3); a first control assembly (24) for guiding the beam along the joint line (2) and for deflecting the beam at successive positions onto the joint line; and a second control assembly (22) into which the beam (4) is launched for deflecting the beam at selected positions into the first control assembly. In an embodiment, X-rays are generated and detected to monitor the condition of the weld.

21 Claims, 9 Drawing Sheets

CONTROLLING CHARGED PARTICLE BEAMS

FIELD OF THE INVENTION

The invention relates to methods and apparatus for controlling a beam of charged particles for the purposes of material processing in defined paths and weld analysis.

DESCRIPTION OF THE PRIOR ART

Charged particle beams such as electron beams find particular application in the conditioning of metals and other materials by for example local hardening and deposition as well as the cutting and welding of workpieces.

A major problem exists in the welding of tube or pipe.

External circumferential butt welding of tube and pipe in situ where neither tubular component can be rotated is at present almost entirely carried out by arc or plasma welding in which welding proceeds by translation by orbital motion of a welding torch or head around the components to be joined. For thin wall tube the process may only require one pass, but usually requires the addition of filler. In the case of arc and even plasma welding the transfer of heat into the liquid metal weld pool is almost entirely by conduction through the liquid which leads to considerable heat spread and a relatively large weld pool. Since penetration in the liquid pool is limited, it is customary to provide a "V" preparation and welding proceeds by the laying down of numerous overlapping passes.

Orbital tube welding can also be effected by propelling an arc struck between the tubular components around the tube periphery by means of a radial magnetic field (eg. by MIAB welding) but the weld quality in this case is generally not very good and it is particularly difficult to avoid ragged protruding weldbeads on the inside and outside surfaces. This method also requires the tube to be separated and then forcibly brought together to produce a forge weld.

In the case of all arc welding processes it is necessary to provide a gas in which the arc is struck. For welding in situations where the environment gas pressure is not close to one atmosphere this would necessitate the supply and containment of a gas at approximately one atmosphere to allow an arc to be struck and sustained.

Stationary tubes and pipes may also be joined by processes such as radial friction welding in which a consumable collar is rotated in contact with a previously prepared "V" preparation. The process, however, necessitates substantial mechanical forces and a very high peak power input. Also the equipment by its nature tends to be relatively bulky and heavy.

Circumferential butt joining of static tubular parts can also be achieved by means of hot pressure or diffusion bonding but again this generally requires a very high power input which must be maintained for extended periods (eg. ¼ hr-5 hrs). In addition there are currently substantial difficulties in verifying the integrity of such solid phase bonds; an NDT (non-destructive testing) technique has yet to be devised which will differentiate between a satisfactory bond and parts which have merely been pressed into very intimate contact whilst achieving only a partial metallurgical bond.

Alternatively tubular welding can be achieved by explosive welding but this involves lapping one part over the other and may not be acceptable for certain applications where detonation of explosives could cause damage to connecting or nearby components of pipework systems.

One other possible method of effecting a tubular weld consists of orbiting a laser beam head or laser beam in conjunction with a system of mirrors around the components to be joined. Unfortunately lasers tend to be rather cumbersome and delicate devices, with relatively limited capability of penetrating metals. In addition they are very inefficient in conversion of electrical power into light and a large proportion of the laser beam power is lost by reflection from the workpiece surface. Also no simple means has yet been found to orbit a powerful beam of light around a static long tubular object to accomplish a circumferential butt weld.

In the case of annular glow discharge welding it is possible to produce an annular sheet of electrons which can produce a "single shot" weld between two abutting tubular components but the peak power demand is very high and the power density in the beam and the weld penetration mechanism is generally unsuitable for producing anything other than a conduction weld. Therefore penetration of metals is limited while the total energy requirements per weld are very high. In addition it is necessary to provide a gaseous atmosphere to allow formation of a suitable glow discharge in order to generate the annular electron beam from a cold cathode. Furthermore present available glow discharge devices are limited in power.

Other more conventional electron beam systems have been devised for tube and pipe welding but these rely on the translation of an electron gun or gun column in orbital fashion around the components to be welded. Consequently, the equipment tends to be cumbersome and requires considerable radial clearance. The need to provide a rotation mechanism is a further complication and by definition involves moving parts and a motor drive system. This applies also to the converse system where the tubular pipe is rotated in front of a fixed electron beam generator.

Similar problems arise in the cutting of curved workpieces as well as in local hardening, heating and deposition applications.

SUMMARY OF THE INVENTION

In accordance with one aspect of the present invention, a method of causing a beam of charged particles to impinge on a surface of a workpiece along an impingement path comprises causing the beam to travel along a first path spaced from the workpiece surface; and successively deflecting the beam at a series of positions along the first path to cause the beam to impinge on the surface at positions along the impingement path.

The direction of impingement may be substantially perpendicular to the work surface, or within the range of ±45° of the normal and in the plane of the path.

The invention enables the beam to impinge on complex impingement paths by deflecting the beam at positions along the first beam path. This is particularly useful in the case where the impingement path is curved away from the beam generation axis.

Preferably, the impingement path is defined in a plane, the beam path also being defined in the same plane. By causing the beam to travel in the plane containing the impingement path it is a very simple matter to cause the beam to deflect towards the path and this also leads to a simple constructional arrangement avoiding the need for any relative mechanical movement between the beam source and workpiece. In this case, it will be appreciated that the impingement path could be interconnected with other impingement paths defined in different planes transverse to the one plane in which case the beam would be deflected into the appropriate planes.

Preferably, the beam impinges on the surface at a series of overlapping positions so that a continuous portion of the surface is exposed to the beam. This reduces liquid metal flow and avoids excessive outer surface sinking in the case of welding tubular components.

One of the major advantages of the invention is that the beam source and the surface can remain stationary relatively to one another thus avoiding the problems mentioned above in connection with rotating a beam source around an annular workpiece. This has a number of useful applications where a large workpiece is involved and also for use in space where it is generally impractical to use conventional techniques for causing relative movement of the beam source.

Thus, the invention is particularly applicable to situations in which the impingement path is curved as in acting on tubular components.

Preferably, the first path follows the impingement path and conveniently is substantially parallel to (or concentric with) but spaced from the workpiece.

The beam is preferably controlled by generating a first guiding field which causes the beam to travel along the first path and locally varying the field along the first beam path to deflect the beam.

Conveniently, the first guiding field is varied by superimposing an additional local field or otherwise locally varying the guiding field intensity.

Preferably, where a curved impingement path in one plane is involved, the step of causing the beam to travel along the first path comprises generating a guiding field transverse to the plane and launching the beam into the field tangentially to but spaced from the impingement path.

In the case where the impingement path is closed, it is often desirable for the beam to be caused to impinge along the entire impingement path and to continue at least partially around the path again so as to overlap the first impingement positions. This could be achieved by causing a small amount of relative movement between the beam source and workpiece.

Preferably, however, the beam is guided along a second path spaced from the first path and extending at least partially alongside the first path, the beam being deflectable at selected positions along the second path into the first path. This allows overlap to be achieved without moving the source or workpiece. Conveniently, the beam is launched into the second path.

The beam may be controlled in the second path by generating a second guiding field which causes the beam to travel along the second path and locally varying the second guiding field along the second beam path to deflect the beam into the first beam path.

The first and second guiding fields may be of any conventional type such as a magnetic field, an electrostatic field, or a combination of both types of field.

The beam of charged particles conveniently comprises an electron beam although the invention is equally applicable to other types of charged particle beams such as ion beams, proton beams and even arcs.

The invention may be used in a variety of material processing applications as indicated above but is particularly applicable to welding.

The invention may be used with tubular workpieces both circular and non-circular such as oval, square, and rectangular as well as solid workpieces having a similar variety of cross-sections. In addition the invention could be used with planar workpieces, particularly where access would normally the difficult.

In general, the impingement path may be closed but in some cases the path may be open ended.

The invention could be used for high speed welding where very high joining rates are necessary or minimum weld times are required by using the beam to heat up the entire joint (defining the impingement path) to a melting temperature and then allowing solidification to occur. This could also involve the application of a forging force to consolidate the weld.

The beam may be pulsed or continuous, a pulsed beam combined with a stepped progression from one position on the surface to another allowing welding time and average power inputs to be minimised.

Preferably, however, the beam is caused to move substantially continuously along the impingement path as opposed to a stepped progression.

Other advantages of the invention not mentioned above include the possibility of obtaining a light weight, compact system which, in the case of welding, may occupy less volume than the zone swept by a conventional orbital electron beam welding gun. The invention is readily adaptable to deal with a wide range of workpiece sizes and material types and is also efficient in utilisation and conversion of electrical power into beam power and effective material processing speed. This together with the lightweight advantage make the invention particularly applicable to use in space.

In the case of welding, single pass welding is possible with the invention and very high rates of joining components are readily achievable. Furthermore, high weld integrity is assured comparable with conventional electron beam welding.

If the invention is to be used in a terrestrial environment then it is necessary to evacuate the region through which the beam passes. However, of the method is to be used in a space environment, evacuation is not necessary since the environment itself is already at a sufficiently low ambient pressure. In fact, a vacuum of better than $3 \times 10^{-4}$ torr is achieved at an altitude of less than 100 km. This vacuum is sufficient to enable the invention to perform satisfactorily.

In accordance with a second aspect of the present invention, apparatus for causing a beam of charged particles to impinge in a substantially evacuated atmosphere on a surface of a workpiece along an impingement path comprises a beam source; and first control means for causing the beam to travel along a first path spaced from the surface and to deflect at a series of positions along the first path towards the surface so that the beam successively impinges on a series of positions along the impingement path.

The source may comprise a conventional source such as an electron beam source.

Preferably, the first control means causes the beam to travel near to but spaced from the work surface until it is deflected towards the surface.

The first control means may include a first guiding field generator for generating a first guiding field to cause the beam to follow the first path and for locally varying the first guiding field to deflect the beam. For example, the first guiding field generator may comprise a magnetic field generator or an electrostatic field generator.

The first guiding field generator may be provided by coil pairs positioned on either side of and along the first path of the beam, the pairs being operable together to generate the first guiding field and being individually (in pairs), successively operable to generate a more intense, local field to cause the beam to deflect towards the surface.

Preferably, the apparatus further comprises second control means for causing the beam to travel along a second path extending at least partially alongside the first path and to deflect at selected positions along the second path into the first path.

The second control means may include a second guiding field generator for generating a second guiding field to cause the beam to follow the second path and for locally varying the second guiding field to deflect the beam. For example, the second guiding field generator may comprise a magnetic field generator or an electrostatic field generator.

The second guiding field generator may be provided by coil pairs positioned on either side of and along the second path of the beam, the pairs being operable together to generate the second guiding field and being individually (in pairs), successively operable to generate a more intense, local field to cause the beam to deflect towards the first path.

Preferably, the first (and second) control means are adapted to be mounted about a curved surface of a workpiece. In one example, the control means are adapted to be mounted around the entire cross-section of a workpiece such as a tubular workpiece.

In some arrangements, the or each guiding field generator may comprise a constant guiding field generating means (such as permanent magnets) to generate a constant field on which is superimposed a number of local fields.

The control means may be built up in the form of a flexible "chain" of variable geometry to allow the apparatus to be used with a wide range of workpiece sizes and impingement path lengths.

Preferably, the apparatus further comprises a guide tube through which the beam is adapted to pass prior to reaching the influence of the control means, passage of the beam through the guide tube being substantially unaffected by the control means.

Where the control means includes a guiding field generator, the guide tube is preferably made of a shielding material. For example, where the deflection field is a magnetic field, the guide tube may be made of a ferromagnetic material.

The use of a guide tube is important in certain applications to prevent the beam being affected by the control means too early in its trajectory.

In order to use the apparatus in a terrestrial environment, the apparatus may be combined with an evacuation assembly to evacuate the region through which the beam passes. In a space environment, the use of an evacuation assembly is not necessary since the pressure should be sufficiently low.

In welding t is necessary to ensure that a weld is correctly formed. One way of achieving this is to expose the weld to X-rays and then to detect the rays passing through the workpiece so as to form an image of the weld on a suitable detector. One of the problems with this arrangement arises particularly with workpieces having closed curved surfaces such as tubular workpieces since relative motion must be produced between a workpiece and the X-ray source so that the entire weld is exposed to X-rays. This is particularly difficult where large workpieces are concerned which cannot themselves be rotated thus necessitating movement of the X-ray source.

In accordance with a third aspect of the present invention, a method of investigating the integrity of a weld comprises causing a beam of charged particles to imping on successive positions along an X-ray generating member the power and accelerating. voltage of the beam eing sufficient to cause penetrating X-rays to be emitted by the member; causing the X-rays to pass through part of a weld; and detecting the emitted X-rays so as to monitor the condition of the weld.

This aspect of the invention deals with the problem mentioned above by avoiding the need for a separate X-ray source and using the same beam generator as was used in the welding step although with a lower power.

In some cases, the X-ray generating member could be provided by the tube itself.

This aspect of the invention is particularly suitable for use in conjunction with the first and second aspects of the invention and enables a weld to be both executed formed and checked in just two passes of the beam of charged particles. However, this third aspect of the invention can also be used in conventional electron beam welding in which relative motion between the source and workpiece takes place. This third aspect of the invention can also be used in conjunction with the methods and apparatus described in our copending US patent application of even date entitled "Charged Particle Beam Generator".

Preferably, the beam is scanned transversely to the direction of the weld to enable the entire cross-section of the weld to be investigated.

BRIEF DESCRIPTION OF THE DRAWINGS

An example of an electron beam welding method and apparatus in accordance with the invention will now be described with reference to the accompanying drawings, in which.

DETAILED DESCRIPTION OF EMBODIMENTS

Figure 1:
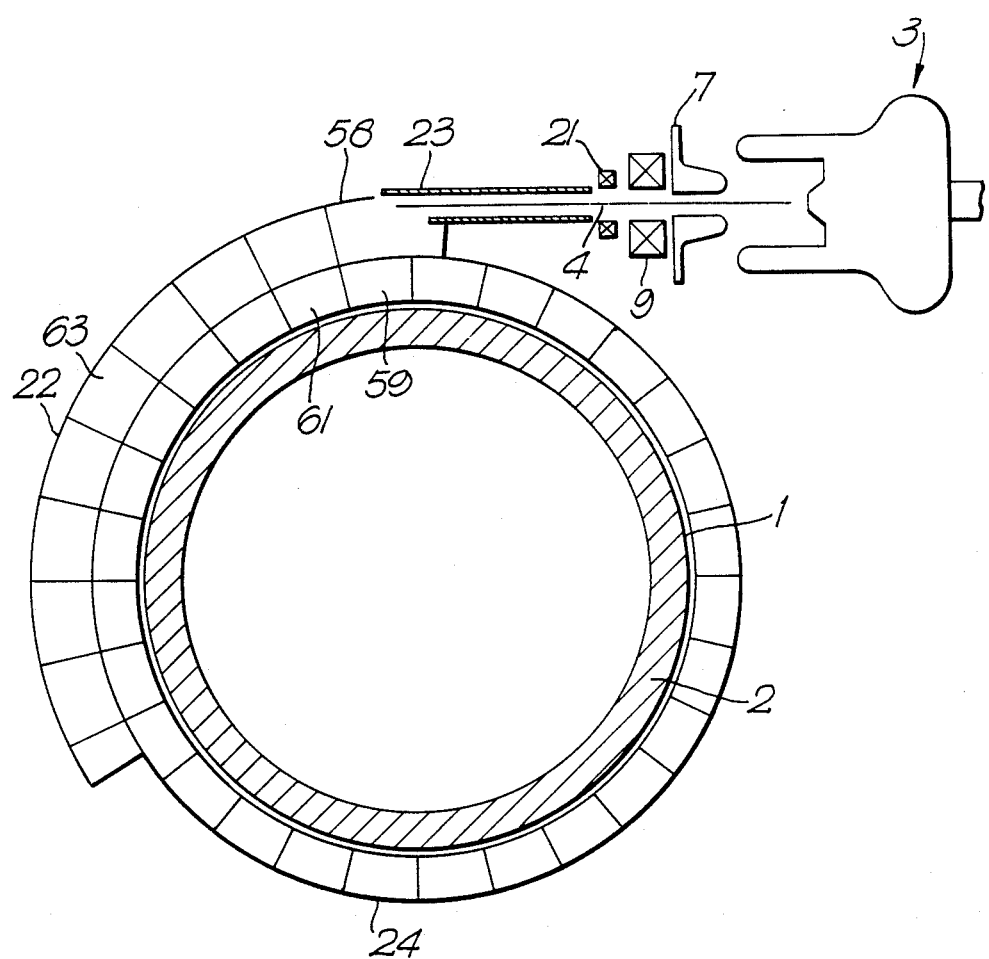
FIG. 1 is a schematic cross-section of the apparatus coupled with a tubular workpiece.

The apparatus shown in FIG. 1 is for welding a workpiece comprising a pair of tubes 1 and 1A only one of which (1) is shown in FIG. 1. The joint plane 2 between the tubes defines the beam impingement path which is circular. A conventional electron beam gun 3 (for example a 15 kV gun) is mounted to a support (not shown). The gun 3 generates a pencil electron beam 4.

Figure 2:
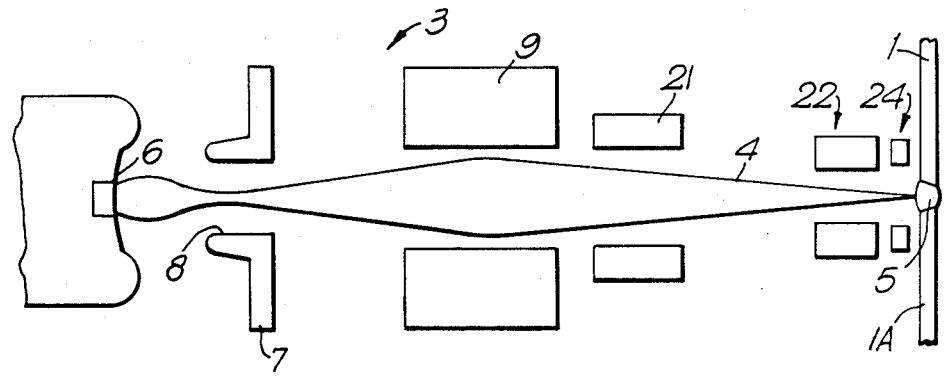
FIG. 2 illustrates schematically the electron beam source in more detail viewed as a two dimensional projection normal to the beam axis.

The electron beam gun 3 is of a conventional construction shown schematically in FIG. 2. The gun comprises a cathode 6 which is heated to a temperature such that electrons are emitted from the surface of the cathode. A tubular anode 7 is positioned close to the cathode so that electrons emitted from the cathode 6 accelerate towards the anode 7 and pass through a central bore 8 of the anode. The accelerated electrons pass through a conventional focussing lens 9 which focusses them onto the workpiece surface. The beam then passes between two pairs (X,Y) of orthogonally oriented deflection coils, one pair of which 21 is shown. The beam is then launched tangentially into a second or radially outer beam control assembly 22 to be described.

It has been found that in practice in order to inject the beam 4 into its correct trajectory, it is necessary to mount a launch tube 23 onto the gun 3, the launch tube extending into the second control assembly 22. The launch tube 23 acts as a magnetic screen so that the beam is unaffected by the magnetic field generated by the second control assembly 22 while it is within the tube 23. To achieve this screening, the launch tube 23 may be made of a ferromagnetic material or of for example mild steel with a high permeability liner causing the surrounding magnetic field to by pass the beam region.

Figure 3:
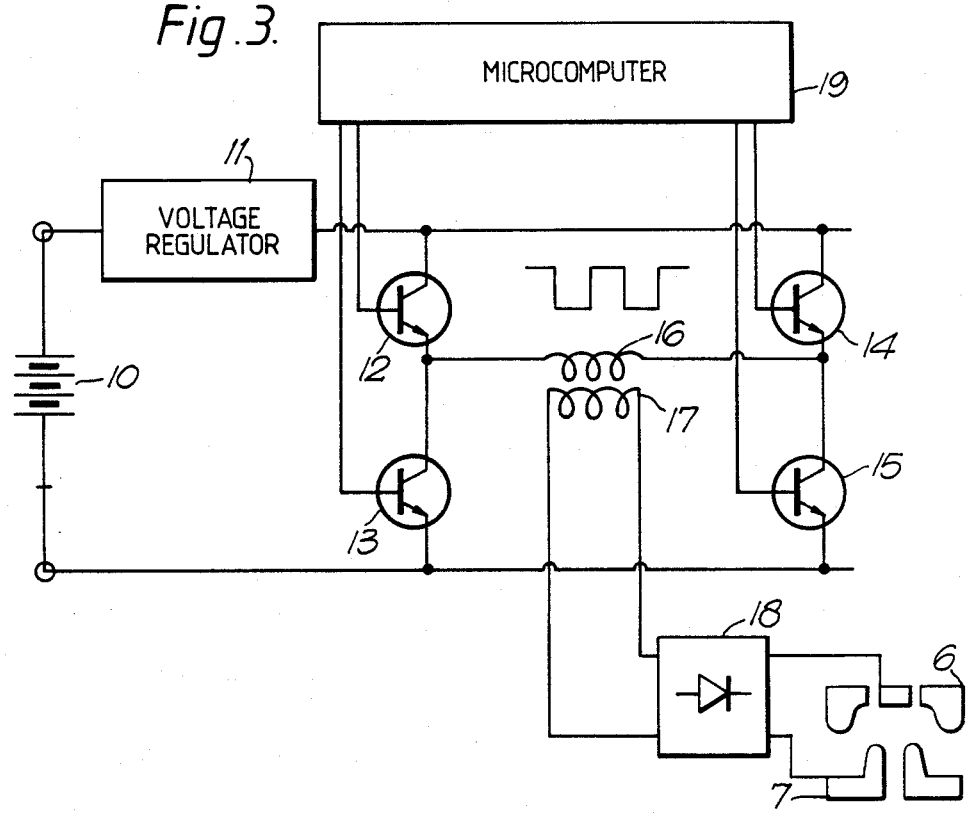
FIG. 3 is a circuit diagram illustrating the electron beam source control circuit.

The control circuit for operating the electron gun is shown in FIG. 3. A DC source 10 is connected to a voltage regulator 11. This is to deal with the problems of a potentially large load on the supply 10 which might be unacceptable in space applications where the supply 10 is the main supply to other equipment in a space station Two transistor pairs 12,13; 14,15 are connected in parallel with the supply 10 and a primary coil 16 is connected between the collectors of the transistors 13, 15. A secondary coil 17 is connected via a high voltage rectifier 18 across the cathode 6 and anode 7 of the electron gun.

A microcomputer 19 of a conventional form is programmed to switch on and off alternately the transistor pairs 12, 15 and 14, 13. This causes a continuous current to flow in the circuit containing the secondary coil 17, the cathode 6 and the anode 7.

Mounted around the tubes 1, 1 in alignment with the joint 2 are a first or radially inner and the second beam control assemblies 24, 22. The first beam control assembly 24 comprises an annular array of spaced, juxtaposed pole piece pairs 25 (FIG. 4) mounted at a radially inner position within a U-shaped recess 26 of a support housing 27. The second control assembly 22 extends partially around the first control assembly 24 (as shown in FIG. 1) and comprises a second set of annularly spaced, juxtaposed pole piece pairs 28 mounted radially outwardly of the pole pairs 25 within the recess 6 of the housing 27. Each of the pole pieces of each pair 25, 28 is formed from a web portion 29 and a flange portion 30 shaped to cause magnetic flux lines between pairs of pole pieces to constrain the trajectory of electrons to a predetermined path.

Figure 4:
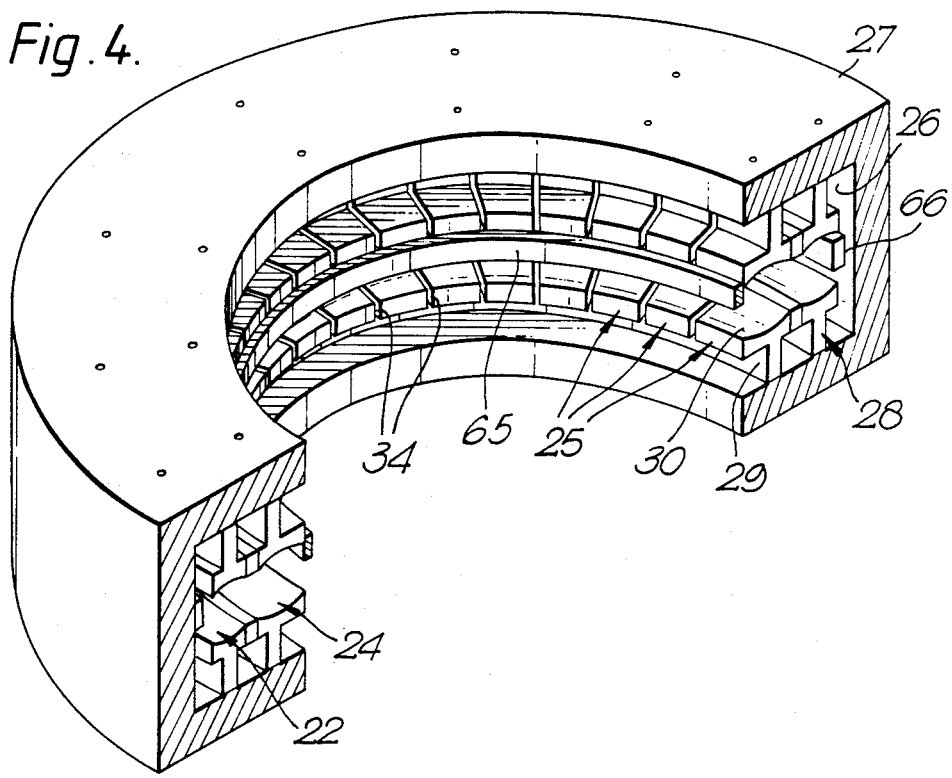
FIG. 4 is a perspective view of part of the beam control assembly with the electrical coils omitted for clarity.
Figure 5:
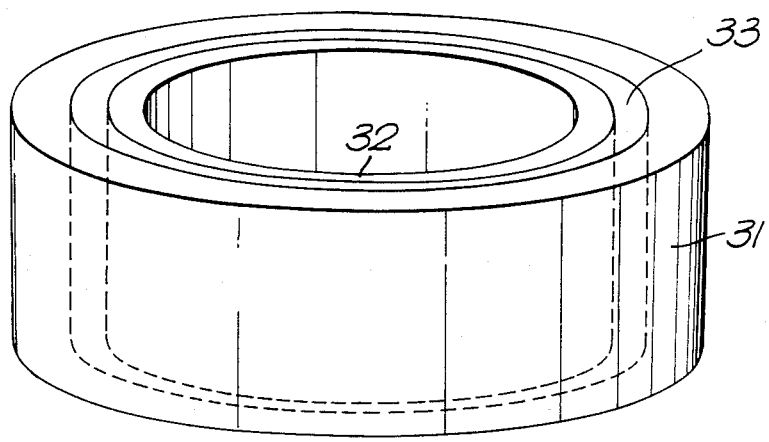
FIG. 5 is a schematic, perspective view of a composite structure from which the beam control assembly is formed.

Typically, the housing 27 is formed in two sections (only one of which is shown in FIG. 4) which are hinged together by means not shown so that the housing can be clamped around the joint plane 2.

In the case where the apparatus is used in a terrestial environment, the housing 27 would need to be sealed to the tubes 1, 1A and be provided within a sealed enclosure into which the electron gun 3 injects the beam 4. The seals could be "0" rings or inflatable seals. Once the housing 27 had been mounted around and sealed to the tubes 1, 1A, the sealed space would be evacuated using a pump.

The housing 27 is constructed from a composite assembly comprising concentric rings of soft iron 31, 32 which sandwich between them a ring of austentic stainless steel 33, the rings 31–33 being electron beam welded together. From this composite component, the pole shapes are machined. This process allows very accurate alignment of the pole pieces by providing a non-magnetic material (the stainless steel 33) between adjacent pole pieces. A stainless steel insert 49 is shown in more detail in FIG. 10.

Figure 8:
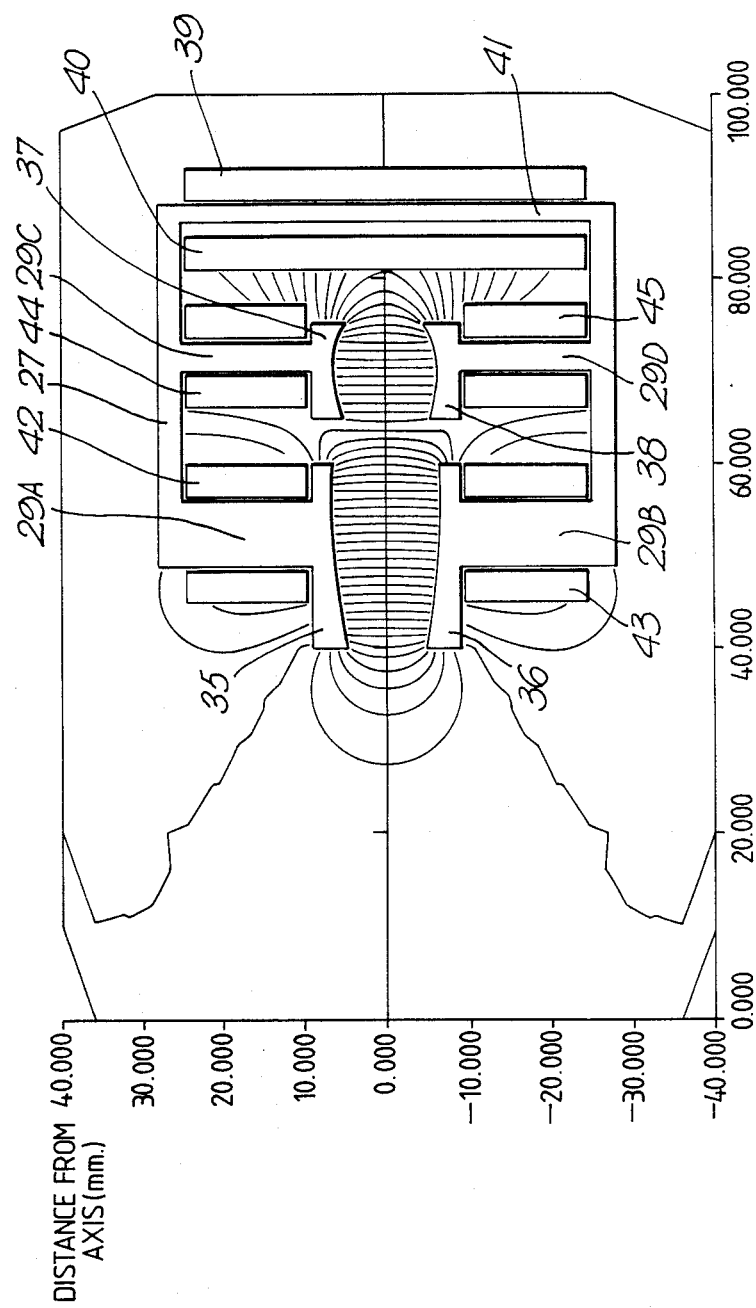
FIG. 8 is a cross-section through the inner and outer beam control assemblies and illustrating the variation in magnetic flux between the pairs of pole pieces.

FIG. 8 is a cross-section through one pair of the pole pieces 35, 36 of the first control assembly and one pair of the pole pieces 37, 38 of the second control assembly. As can be seen in FIG. 8, a pair of primary coils 39, 40 are wound around the outer and inner surfaces respectively of an outer wall 41 of the housing 27. These coils 39, 40 provide a basic, constant magnetic field for both the first and second control assemblies. Around each web 29A–29D of the pole pieces is wound an individual coil 42–45 to enable local magnetic fields to be set up between opposed pole pieces 35, 36; 37, 38 as required. A typical arrangement of flux lines due to the coils 39–45 is shown in FIG. 8.

Figure 6:
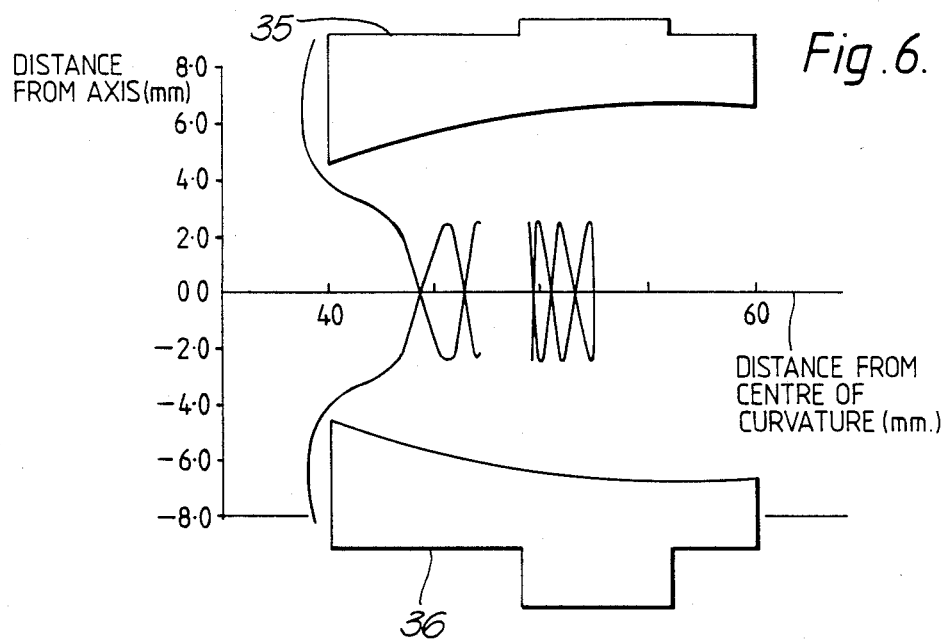
FIG. 6 is a cross-section through a pair of pole pieces of the radially inner beam control assembly and illustrating graphically the variation in beam trajectories for an initially diverging beam.
Figure 11:
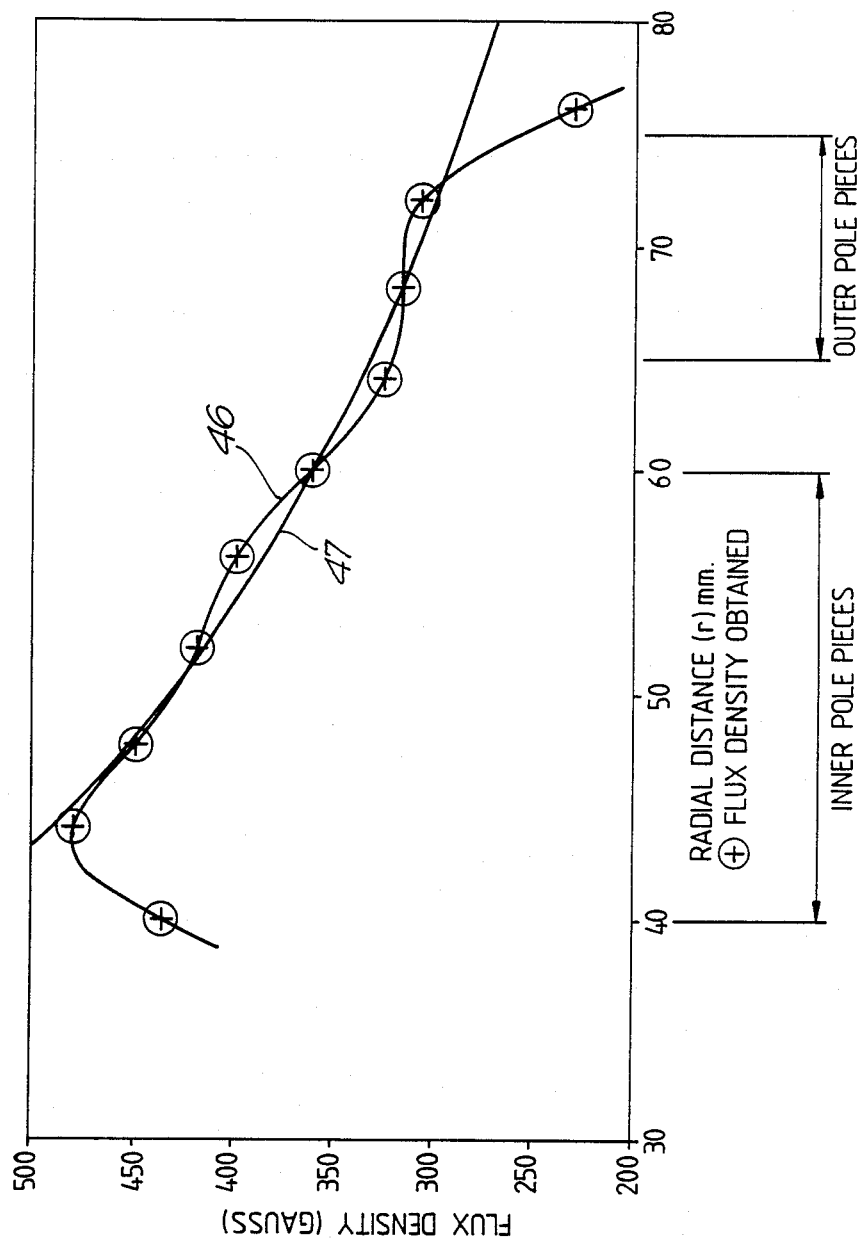
FIG. 11 illustrates graphically the variation in flux density between the respective pole piece pairs of the inner and outer beam control assemblies when they are adjusted to cause electrons to pass along the first and second paths, and for comparison an ideal variation in flux density; and, FIG. 12 is a partial block diagram of a circuit for controlling energisation of the coils.

The trajectory of an electron beam between a pair of opposed pole pieces such as the pole pieces 35, 36 depends on a number of different factors. Most importantly, the trajectory depends on the initial form of the beam (collimated, diverging, or converging) launched by the gun 3 and the shape of the pole pieces and hence the form of the magnetic flux between the pole pieces. FIG. 11 illustrates graphically by a line 46 the variation in magnetic flux due to the pole pieces of the two control assemblies. For comparison the ideal variation in flux density is indicated by a line 47. FIG. 6 illustrates the electron beam trajectories for a 0.5° diverging 15 kV beam and it will be seen that in this case dispersion of the beam, and hence loss of electrons around the edges of the pole pieces 35, 36 occurs. It has been found that this dispersion occurs after less than 360° of deflection by the first control assembly.

Figure 7:
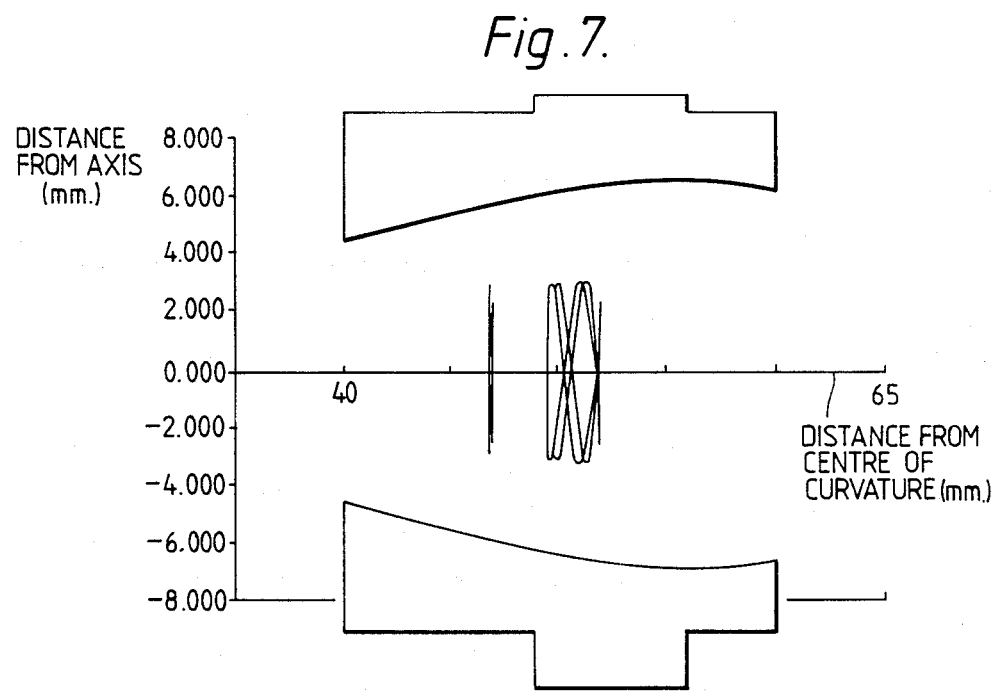
FIG. 7 is a view similar to FIG. 6 but for an intitially converging beam.

In contrast, FIG. 7 illustrates the trajectories for a 0.5° converging 15 kV beam where it will be seen that dispersion does not occur.

Figure 10:
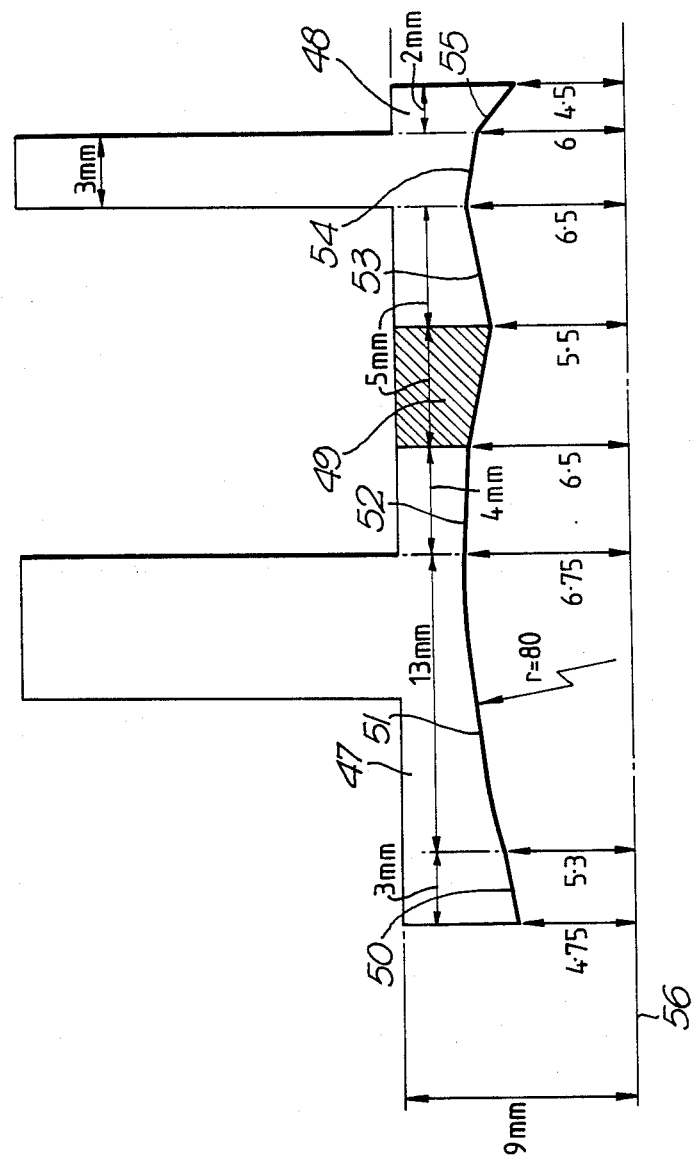
FIG. 10 illustrates an example of pole piece design for pole pieces of both the inner and outer beam control, assemblies in detail.

A particular example of the construction of the pole pieces is shown in FIG. 10. This illustrates a pole piece 47 of the first control assembly and a pole piece of the second control assembly linked by an insert 49. The pole piece 47 is made up of a planar section 50, a curved section 51 and a planar section 52. The pole piece 48 is made up of three planar sections 53–55. The dimensions (in millimetres) of the sections 50–55 are shown in FIG. 10 by reference to a median plane 56 extending between opposed pole pieces.

Figure 9A:
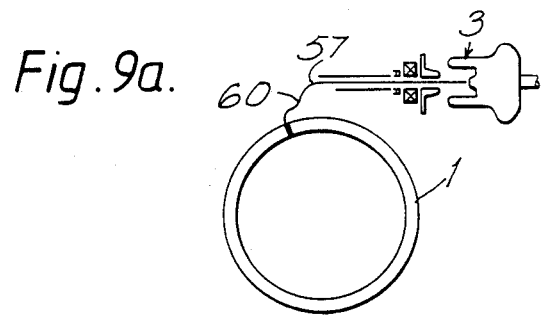
FIGS. 9a–9d illustrate different stages in the passage of an electron beam around a tubular workpiece during a weld operation.

In operation, the coils 39, 40 are activated and the coils 42, 43; 44, 45 of each pair of pole pieces are activated by respective control circuits (FIG. 12) so that a constant, magnetic field is generated around the tubes 1, 1A. The strength of the magnetic fields of the first control assembly 24 is chosen such that if the electron beam 4 were injected into the first control assembly 24 it would circulate along a first path in the plane of the joint wound the joint and coaxial with it. Initially, as shown in FIG. 9a, the electron beam is launched along a second path 57 into the region between the leading pair of pole pieces 37, 38 of the second control assembly 22. This pair of pole pieces is indicated by a segment 58 in FIG. 1. The coils 44, 45 associated with the leading pair of pole pieces are controlled to generate a magnetic field which in combination with the field due to the coils 39, 40 causes the electron beam to deflect towards and into the first control assembly 22. This will cause the beam to enter a segment 59 of the first control assembly defined by a pair of opposed pole pieces 35, 36. The coils 42, 43 associated with the pole pieces 35, 36 of the segment 59 are controlled to generate a magnetic field which in combination with the field due to the coils 39, 40 causes the beam to deflect towards the joint 2 along a deflection path 60. Depending upon the power and power density of the beam 4, it will either pass through the joint 2 or, if it is of a weaker intensity, it will simply heat up the material of the tubes 1, 1A adjacent the joint 2 at the point of impingement but without passin right through the joint. In either case, when the beam 4 moves away from this point, the heated material will solidify thus producing a weld 5 (FIG. 2).

After the coils associated with the first segment 59 of the first control assembly 22 have been energised for a predetermined length of time, they will be caused to adjust the magnetic field so as to cause the electron beam to pass to the next adjacent segment 61. The coils of this segment 61 will be activated to cause the beam after passing along a first path 62 between the segment 59 and the segment 61 to deflect towards the joint 2.

Figure 9B:
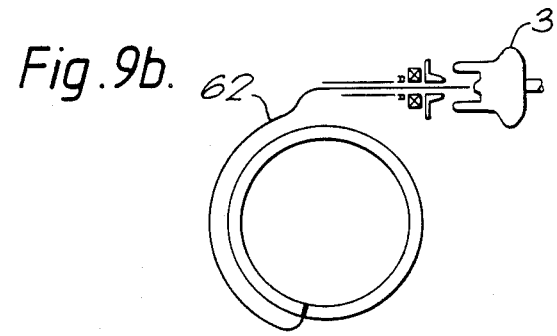
Figure 9C:
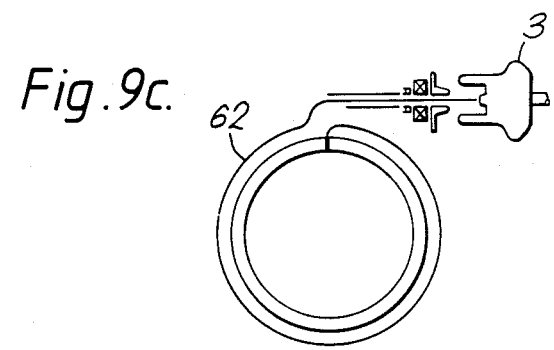

This process is then repeated for each of the segments of the first control assembly 22 as indicated schematically in FIGS. 9b and 9c.

Figure 9D:
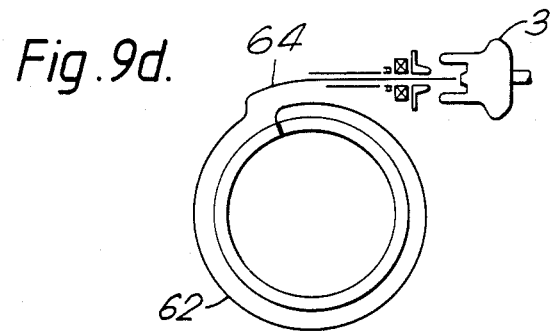

In general, it is desirable for the beam to wrap around the entire joint 2 and to overlap the initial portion of the original weld 5. To achieve this, once the beam has reached the position shown in FIG. 9c, the coils of the segment 58 of the second control assembly 24 are activated to cause the beam, after being launched from the guide tube 23, to pass along an extended second path 64 through a number of the segments of the second control assembly, for example to the segment 63. After passing along this second path 64, the beam is deflected into the first control assembly 22 by suitably activating the coils in the segment 53, as shown in FIG. 9d. This then allows the first control assembly 22 to guide the beam past its initial impingement position on the joint 2.

To cause the beam to deflect out of a segment, it is necessary to intensify the magnetic field generated between the appropriate pair of pole pieces and this can be achieved simply by increasing the activating current in each coil. The energisation of successive coil pairs may be accompanied by deenergisation back to the original level of the previously energised coil pair.

Alternatively, particularly with the first control assembly, each coil pair may be progressively energised while preceding pairs are progressively de-energised. In the first case, a stepwise progression or translation of the impingement position of the beam will take place along the joint 2 whereas in the second case a much more gradual progression will occur resulting in a more uniform motion of the point of impingement.

The rate of switching between coils may be in accordance with the formula $$\frac{\text{angular rate of welding}}{2\pi} \times \text{No. of coil pairs}$$

Alternatively, the current passing through the tubes could be monitored (so called "through current") to give an indication of the point at which switching should occur.

It may be necessary to change the focus of the beam as it progresses around the weld.

In one example where a 60 mm diameter pipe is welded, the controlling, axial field generated by the coils 39, 40, 42–45 may be 151 gauss for an electron beam acceleration voltage of 50 kV leading to a radius of curvature for the second path 64 of 50 mm the second path being at a nominally 20 mm spacing from the tube surface. The local field necessary to deflect the beam into its first path 62 (radius of curvature say 10 mm) would be five times the controlling field.

Where possible, an absorption member (not shown) should be positioned within the tubes 1, 1A to prevent charged particles which are passed through one wall of the tubes impinging on the opposite wall thus possibly damaging the surface.

Figure 12:
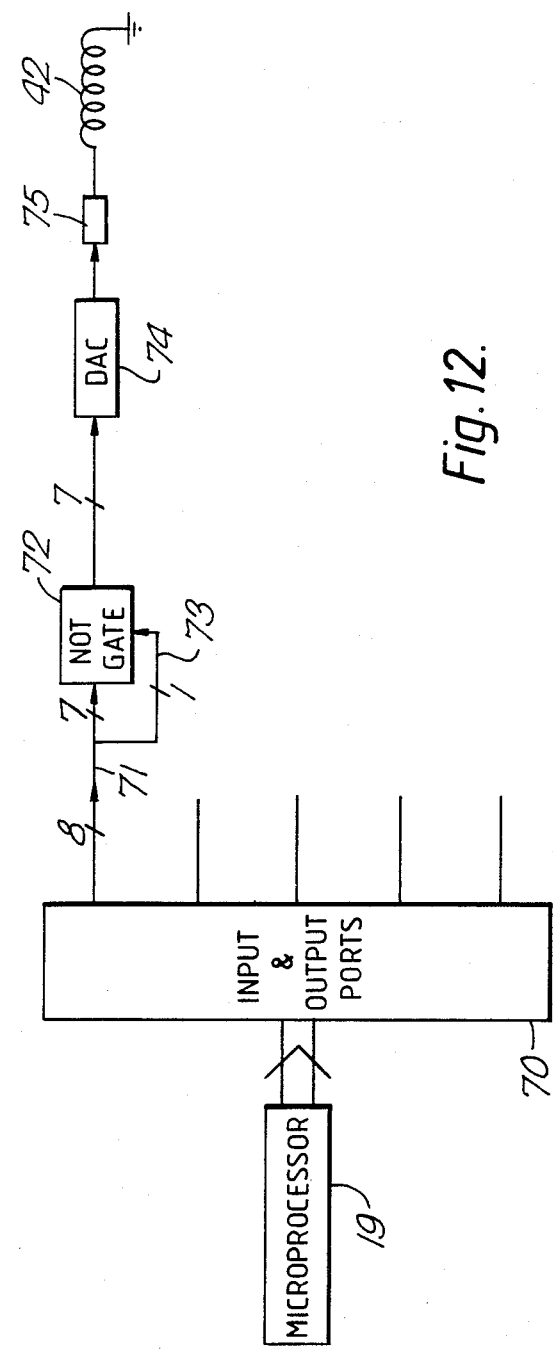

A circuit for energising the coils such as the coils 42,43 is illustrated schematically in FIG. 12. The microprocessor 19 is connected with an input/output port module 70 having a number of output ports to each of which is coupled a respective electrical coil. For simplicity, FIG. 12 shows the connection of one of the output ports with a coil 42. The connection with each coil 42 is via an 8 bit line 71. Seven of these lines are coupled to the input of a NOT gate 72 whose condition is set by the remaining bit which is fed to the gate on a line 73. The NOT gate 72 is required so that both positive and negative going currents can be generated through the coil 42. The suitably modified seven bit data defining the current magnitude is fed to a digital-to-analogue converter 74 whose analogue output current is fed via a limiting resistor 75 to the coil 42.

The microcomputer is programmed to cause appropriate coils to be energised by outputting appropriate 8 bit control words from one or more of the output ports.

In general, a single pass of the electron beam will be sufficient to weld the tubes 1, 1A together. After this pass, the weld quality can be assessed by carrying out a second pass of the electron beam but at lower beam current and possibly higher accelerating voltage in order to achieve penetrating X-rays. To generate X- rays, the beam is deflected by the deflection coils 21 to impinge on a tungsten tip of an annular, aluminium member 65 mounted to a radially inner surface of the flange portions 30 of one of the sets of pole pieces of the first control assembly 24. In some examples, the X-rays could be produced by the tube material itself.

An annular diode array is mounted around the joint 2 and in one convenient arrangment shown in FIG. 4, the diode array 66 is mounted to a radially inwardly facing surface of the recess 26 to receive X-rays passing between the opposed pole pieces. In this case, the coil 40 could consist of two separate coils to provide a central region for inclusion of the diode array member.

We claim:

1. A method of causing a beam of charged particles to impinge on a surface of a workpiece defining an impingement path, the method comprising causing said beam to travel along a first path spaced from a surface defined by said workpiece said first path being defined by a set of first guide members between which a first guiding field is generated, said first guide members being shaped so that said first guiding field has substantially no dispersing effect on said beam; and successively deflecting said beam at a series of positions along said first path to cause said beam to impinge on said surface at positions along said impingement path.

2. A method according to claim 1, wherein said first path is substantially parallel to said workpiece.

3. A method according to claim 1, wherein said beam is successively deflected by locally varying said first guiding field along said first beam path.

4. A method according to claim 1 in which said impingement path is closed, the method further comprising causing said beam to impinge along the entire impingement path starting at a first impingement position and to continue at least partially around said impingement path again so as to overlap said first impingement position.

5. method according to claim 1, wherein said beam is guided along a second path spaced from said first path and extending at least partially alongside said first path, said beam being deflectable at selected positions defined by said second path into said first path.

6. A method according to claim 5, wherein said beam is controlled in said second path by generating a second guiding field which causes said beam to travel along said second path and by locally varying said second guiding field along said second beam path to deflect said beam into the first beam path.

7. A method according to claim 5, in which said impingement path is closed, the method further comprising causing said beam to impinge along the entire impingement path starting at a first impingement position and to continue at least partially around said impingement path again so as to overlap said first impingement position.

8. A method according to claim 1, wherein said charged particles comprise electrons.

9. A method according to claim 6, wherein said second path is defined by a set of second guide members between which said second guiding field is generated, said second guide members being shaped so that said second guiding field has substantially no dispersing effect on said beam.

10. Apparatus for causing a beam of charged particles to impinge in a substantially evacuated atmosphere on a surface defined by a workpiece along an impingement path defined by said workpiece, the apparatus comprising a beam source; and first control means for causing said beam to travel along a first path spaced from said surface and to deflect at a series of positions along said first path towards said surface so that said beam successively impinges on a series of positions along said impingement path, wherein said first control means includes a set of first guide members between which a first guiding field is generated, said first guide members being shaped so that said first guiding field has substantially no dispersing effect on said beam.

11. Apparatus according to claim 10, wherein said first control means includes means to locally vary said first guiding field to deflect said beam.

12. Apparatus according to claim 10, further comprising second control means causing said beam to travel along a second path extending at least partially alongside said first path and to deflect at selected positions along said second path into said first path.

13. Apparatus according to claim 12, wherein said first and second control means define concentric paths, said second control means being positioned radially outwardly of said first control means.

14. Apparatus according to claim 10, wherein said set of first guide members comprise opposed pairs of magnetic pole pieces.

15. Apparatus according to claim 12, wherein said second control means includes a set of second guide members between which a second guiding field is generated, said second guide members being shaped so that said second guiding field has substantially no dispersing effect on said beam.

16. Apparatus according to claim 15, wherein said set of second guide members comprise opposed pairs of magnetic pole pieces.

17. Apparatus according to claim 14, wherein said first guiding field is generated by a number of individually controllable first coil pairs.

18. Apparatus according to claim 16, wherein said second control means comprises a number of individually controllable second coil pairs.

19. A method of investigating the integrity of a weld, the method comprising causing a beam of charged particles to impinge on successive positions along an X-ray generating member, the power and accelerating voltage of said beam being sufficient to cause penetrating X-rays to be emitted by said member, wherein said beam of charged particles is guided by a set of first guide members between which a first guiding field is generated, said first guide members being shaped so that said first guiding field has substantially no dispersing effect on said beam, causing said X-rys to pass through part of said weld whereby X-rays are emitted from said weld; and detecting said emitted X-rays so as to monitor the condition of said weld.

20. A method according to claim 19, wherein said X-ray generating member extends alongside said weld.

21. A method of welding a joint of a workpiece defined along a beam impingement path and investigating the integrity of said weld, the method comprising (a) in a first pass, causing a beam of charged particles to travel along a first path spaced from a surface defined by said workpiece; and successively deflecting said beam at a series of positions along said first path to cause said beam to impinge on said surface at positions along said impingement path to weld said joint; and (b) in a second pass, causing said beam of charged particles to impinge on successive positions along an X-ray generating member, the power and accelerating voltage of said beam being sufficient to cause penetrating X-rays to be emitted by said member; causing said X-rays to pass through part of said weld whereby X-rays are emitted from said weld; and detecting said emitted X-rays so as to monitor the condition of said weld, wherein in both passes said beam of charged particles is guided by a set of first guide members between which a first guiding field is generated, said first guide members being shaped so that said first guiding field has substantially no dispersing effect on said beam.

* * * * *